US009939321B2

(12) United States Patent
Bartosewcz et al.

(10) Patent No.: US 9,939,321 B2
(45) Date of Patent: Apr. 10, 2018

(54) HYPERSPECTRAL OPTICAL ELEMENT FOR MONOLITHIC DETECTORS

(71) Applicant: L-3 COMMUNICATIONS CINCINNATI ELECTRONICS CORPORATION, Mason, OH (US)

(72) Inventors: Michael Bartosewcz, Mason, OH (US); Tristan Van Hoorebeke, Maineville, OH (US); Phillip Michael Henry, West Chester, OH (US); Anthony William Sarto, Santa Rosa, CA (US)

(73) Assignee: L-3 COMMUNICATIONS CINCINNATI ELECTRONICS CORPORATION, Mason, OH (US)

( * ) Notice: Subject to any disclaimer, the term of this patent is extended or adjusted under 35 U.S.C. 154(b) by 17 days.

(21) Appl. No.: 15/262,801

(22) Filed: Sep. 12, 2016

(65) Prior Publication Data

US 2017/0227398 A1 Aug. 10, 2017

Related U.S. Application Data

(60) Provisional application No. 62/217,231, filed on Sep. 11, 2015.

(51) Int. Cl.
*G01J 3/28* (2006.01)
*G01J 3/26* (2006.01)
(Continued)

(52) U.S. Cl.
CPC .  *G01J 3/26* (2013.01); *G01J 3/12* (2013.01); *G01J 3/28* (2013.01); *G01J 3/2823* (2013.01);
(Continued)

(58) Field of Classification Search
CPC .... G01J 3/26; G01J 3/12; G01J 3/2823; G01J 3/28; G01J 2003/2826; H01L 27/14625; H01L 27/14634; H01L 27/14649
(Continued)

(56) References Cited

U.S. PATENT DOCUMENTS

| 6,212,312 B1 | 4/2001 | Grann et al. |
| 6,897,447 B2 * | 5/2005 | Mitra ........................ G01J 3/26 |
| | | 250/338.4 |

(Continued)

OTHER PUBLICATIONS

PCT International Search Report and PCT Written Opinion of the International Searching Authority dated Nov. 18, 2016 in reference to co-pending International Application No. PCT/US2016/051186, international filing date Sep. 10, 2016.

*Primary Examiner* — William R Alexander
(74) *Attorney, Agent, or Firm* — Dinsmore & Shohl LLP (57) ABSTRACT

A hyperspectral optical element for monolithic detectors is provided. In one embodiment, for example a hyperspectral optical element includes a faceplate layer adapted to be mounted on top of a monolithic detector. The faceplate layer comprises a reflective inner surface. A notched layer includes a plurality of notched surfaces and is mounted to the faceplate layer. The notched surfaces oppose the reflective inner surface of the faceplate and define a plurality of variable depth cavities between the reflective inner surface of the faceplate layer and the plurality of notched surfaces of the notched layer. The faceplate layer and the notched layer are substantially transparent to a received signal and the plurality of variable depth cavities provides resonant cavities for one or more wavelengths of the received signal.

20 Claims, 6 Drawing Sheets

(51) Int. Cl.
  *H01L 27/146*  (2006.01)
  *G01J 3/12*  (2006.01)
(52) U.S. Cl.
  CPC .. *H01L 27/14625* (2013.01); *H01L 27/14634* (2013.01); *H01L 27/14649* (2013.01); *G01J 2003/2826* (2013.01)
(58) Field of Classification Search
  USPC ........................................................ 359/351
  See application file for complete search history.

(56) References Cited

U.S. PATENT DOCUMENTS

| | | | |
|---|---|---|---|
| 6,992,809 B1 | 1/2006 | Wang et al. | |
| 7,135,698 B2* | 11/2006 | Mitra | H01L 27/14649 250/338.1 |
| 8,338,200 B2 | 12/2012 | Forrai et al. | |
| 8,846,432 B2 | 9/2014 | Jones et al. | |
| 9,040,913 B2 | 5/2015 | Savoy et al. | |
| 9,404,804 B1* | 8/2016 | Liu | G01J 5/0014 |
| 2002/0070671 A1* | 6/2002 | Small | H01J 23/165 315/39.51 |
| 2004/0108461 A1* | 6/2004 | Mitra | G01J 3/26 250/339.02 |
| 2004/0108564 A1* | 6/2004 | Mitra | H01L 27/14649 257/442 |
| 2005/0226281 A1* | 10/2005 | Faraone | G02B 26/001 372/20 |
| 2006/0017928 A1 | 1/2006 | Crowther | |
| 2006/0118721 A1* | 6/2006 | Antoszewski | G01J 3/02 250/338.4 |
| 2015/0137295 A1* | 5/2015 | Wehner | H01L 27/14629 257/432 |
| 2016/0266035 A1* | 9/2016 | Scherer | G01N 21/3577 |

* cited by examiner

HYPERSPECTRAL OPTICAL ELEMENT FOR MONOLITHIC DETECTORS

CROSS REFERENCE TO RELATED APPLICATIONS

The present application claims priority to U.S. Patent Application Ser. No. 62/217,231 entitled "Hyperspectral Optical Element for Monolithic Detectors," filed on Sep. 11, 2015, which is hereby incorporated by reference in its entirety.

TECHNICAL FIELD

Embodiments relate generally to infrared sensors and, more particularly, to hyperspectral optical elements for infrared photodetector devices adapted to detect radiation in the infrared spectral range.

BACKGROUND

An infrared focal plane array (FPA) is an imaging sensing apparatus that includes an array of photodetector pixels capable of detecting photons in the infrared spectrum. The pixels of infrared FPAs may be formed of a material that is sensitive to infrared radiation, such as indium antimonide (InSb), Mercury Cadmium Telluride (MCT), gallium arsenide and aluminum gallium arsenide, or other infrared-sensitive detector materials. However, in order to achieve hyperspectral imaging, infrared FPAs having pixels fabricated from such materials to date have required special and bulky imaging systems.

SUMMARY

Embodiments described herein provide a hyperspectral optical element for monolithic detectors leveraging a variable gap to produce resonating hyperspectral responses on a monolithic detector material.

Embodiments also provide a variable gap within the hyperspectral optical element that is constructed by different patterns notched into the notched top material allowing for different wavelengths of hyperspectral responses to be generated.

In one embodiment, a hyperspectral optical element for monolithic detectors is provided. In one embodiment, for example a hyperspectral optical element includes a faceplate layer adapted to be mounted on top of a monolithic detector. The faceplate layer includes a reflective inner surface. A notched layer, such as a notched staircase or other configuration notched layer, includes a plurality of notched surfaces and is mounted to the faceplate layer. The notched surfaces oppose the reflective inner surface of the faceplate and define a plurality of variable depth cavities between the reflective inner surface of the faceplate layer and the plurality of notched surfaces of the notched layer. The faceplate layer and the notched layer are at least substantially transparent to a received signal and the plurality of variable depth resonant cavities provides resonant cavities for one or more wavelengths of the received signal.

According to one embodiment, the focal plane has spectral selective devices comprised of a gap Fabry-Perot etalon integrated into the focal plane array ("FPA") with on-chip thin film filters for side band rejection. In this embodiment, the device may be tunable globally. The patterns can be non-linear or stepped patterns depending on application. The hyperspectral Mid-Wave/Long-Wave sensor in some embodiments also has a unique push broom read out ROIC that is time delay integration (TDI) compatible.

In another embodiment, a hyperspectral detector is provided. The detector includes a monolithic detector including an at least substantially transparent faceplate layer adapted to receive a signal through the faceplate layer and a detector coupled to a first surface of the faceplate layer. The faceplate layer includes an at least partially reflective surface opposite a detector facing surface of the faceplate layer. An at least substantially transparent notched layer includes a plurality of notched surfaces and is mounted to the faceplate layer. The notched surfaces oppose the at least partially reflective surface of the faceplate and define a plurality of variable depth cavities between the at least partially reflective surface of the faceplate layer and the plurality of notched surfaces of the notched layer. The plurality of variable depth cavities provides resonant cavities for one or more wavelengths of the received signal.

In yet another embodiment, a method of separating at least one wavelength from a signal is provided. In this embodiment, the method includes receiving the signal through a notched layer. The notched layer includes a plurality of notched surfaces. A plurality of variable depth cavities are defined between the notched surfaces of the notched layer and a faceplate layer. The method further includes resonating at least one wavelength of the signal within at least one of the variable depth cavities. The resonant wavelength corresponds to a depth of the at least one of the variable depth cavities. The method also concludes separating the at least one wavelength from the signal through the faceplate layer.

BRIEF DESCRIPTION OF THE DRAWINGS

The following detailed description will be more fully understood in view of the drawings in which.

The embodiments set forth in the drawings are illustrative in nature and are not intended to be limiting of the subject matter defined by the claims. Moreover, individual features of the drawings and the embodiments will be more fully apparent and understood in view of the detailed description.

DETAILED DESCRIPTION OF ILLUSTRATIVE EMBODIMENTS

Referring generally to the drawings, embodiments of hyperspectral optical elements for monolithic detectors and fabrication methods thereof are illustrated. Infrared photo-detector devices are photo-voltaic (or photoconductive, depending on doping levels of various semiconductor layers) that are operable to detect radiation in the infrared and/or near infrared spectrum (e.g., mid-wave infrared (MWIR), short-wave infrared (SWIR), and/or long-wave infrared (LWIR)). Infrared devices may comprise, for example, a transparent substrate, a plurality of frontside common electrical contacts and a stack of semiconductor material that forms a pixel. A plurality of pixels of the devices may be coupled to a readout integrated circuit (ROIC), such as via bonding bumps (e.g., an indium bonding bump), thereby providing an infrared photodetector focal plane array having of an array of pixels. The hyperspectral optical elements described herein may be used in any number of infrared detector technologies, including, but not limited to, InSb, mercury cadmium telluride (MCT), etc. Embodiments and systems described are merely examples and are not limiting.

As described in more detail below, a hyperspectral optical element includes an Etalon device comprising a plurality of variable depth gaps. The gaps provide resonant cavities for one or more wavelengths of a received infrared signal (e.g., infrared or near infrared). Each of the cavities receives a signal and one or more particular wavelengths of the light signal resonate in the cavities and are thus separated from the light signal for detection. Within a cavity, light signals reflect from reflective surfaces and wavelengths corresponding to the depth of the cavity resonate within that cavity. Because at least one of the surfaces is partially reflective, some of the signal resonating within the cavity escapes to a detector. The plurality of cavities provide a plurality of spatially distributed filters of the focal plane to provide spatial sampling of spectra along one dimension of the focal plane array and selectively receive the one or more wavelengths of the individual resonant structures defined by the varying depth gaps.

Figure 1:
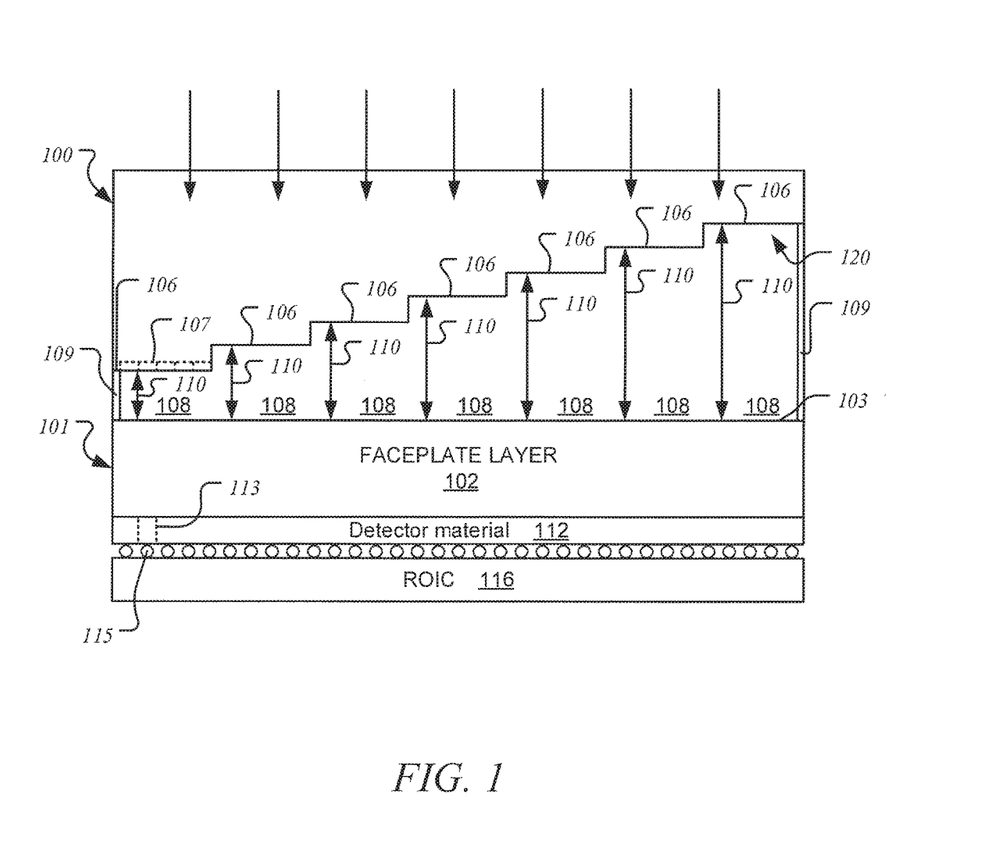
FIG. 1 depicts a schematic illustration of a hyperspectral optical element for a monolithic detector according to one or more embodiments described and illustrated herein.

Referring now to FIG. 1, one embodiment of a hyperspectral optical element 100 configured to collect a plurality of spatial and spectral lines simultaneously from an infrared light signal is schematically illustrated. Generally, the illustrated hyperspectral optical element 100 comprises a transparent faceplate layer 102 and a notched layer 104. The faceplate layer 102 may comprise a transparent (at least to the signals of interest) layer of another optical system, such as but not limited to an infrared focal plane array configured to receive the plurality of spatial and spectral lines from the hyperspectral optical element, or may comprise a separate transparent faceplate layer of a standalone hyperspectral optical element 100. In this particular implementation, for example, the notched layer 104 is disposed adjacent to a transparent layer of an FPA array 101 that serves as the faceplate layer 102 and, thus, the hyperspectral optical element 100 is integrated with the FPA array. The faceplate layer 102 and notched layer 104 are disposed such that notched surfaces 106 of the notched layer 104 and an inner surface 103 of the faceplate layer 102 define a plurality of cavities 108 disposed between the faceplate layer 102 and the notched layer 104. The plurality of notched surfaces 106 have varying depths and the plurality of cavities 108 comprise a plurality of varying depth gaps 110 corresponding to the varying heights of the plurality of notched surfaces 106 in the notched layer 104. The inner surface 103 of the faceplate layer 102 and the notched surfaces 106 of the notched layer 104 are at least partially reflective with respect to the wavelengths of interest (e.g., infrared or near infrared) to provide a resonant cavity for one or more wavelengths of a received infrared signal. One or more at least partially reflective layers, coatings or the like may be disposed on the inner surface 103 and notched surfaces 106, for example.

In one embodiment, for example, each one of the plurality of notched surfaces 106 may comprise one or more pixels 107 of the hyperspectral optical element 100 shown in FIG. 1. In this particular embodiment, a plurality if individual pixels 107 are shown in dashed lines and extend in parallel to each other into the notched layer 104 along each notched surface 106. Although FIG. 1 shows five individual pixels 107 disposed along a notched surface 106, the number is merely an example for ease of illustration. Each notched surface 106 may comprise any number of pixels 107, from a single pixel per notched surface 106 to hundreds, thousands or even more pixels corresponding to each notched surface 106.

Each of the varying depth gaps 110 provide a resonant structure for one or more wavelength of an input signal received by the hyperspectral optical element 100. Within a cavity 108, light signals reflect from the reflective inner surface 103 of the faceplate layer 102 and the notched surface 106 of the notched layer 104 and wavelengths corresponding to the depth of the cavity 108 resonate within that cavity. Because the faceplate layer 102 is partially reflective, some of the signal resonating within the cavity 108 escapes through the faceplate layer 102 to a detector material 112, such as a detector of an FPA, for detection of the signal within one or more pixels 113 of the detector material 112 corresponding to the one or more pixels 107 of the notched layer 104. Pixel 113 of the detector material 112 shown in FIG. 1, for example, corresponds to a pixel 107 of the notched surface 106 of the notched layer 104. The pixels 113 of the detector material 112, for example, of a focal plane array may comprise an array of semiconductor stacks providing an array of photodetector devices corresponding to the pixels 113. The detector material 112 of each pixel may be capable of detecting radiation in the MWIR, SWIR, or LWIR, depending on the desired predetermined wavelength range.

An output signal of the detector material 112 for that pixel 113 is in turn provided to a ROIC 116 via a bonding bump 115. Output signals from other pixels of the detector material 112 are also provided to the ROIC 116 via corresponding bonding bumps as shown in FIG. 1. As described above, the number of pixels and bonding bumps shown in FIG. 1 is merely an example for ease of illustration and not limiting.

The FPA array including the faceplate layer 102, the detector material 112, the bonding bumps 115 and ROIC 116 shown in FIG. 1 is merely one example detector that may be used in conjunction with a hyperspectral optical element 100 such as described herein. Many types of detectors may similarly be used. Examples of detectors include, but are not limited to, the detectors disclosed in U.S. Pat. No. 8,846,432 entitled "Frontside-Illuminated Barrier Infrared Photodetector Device and Methods of Fabricating the Same" and issued to Robert A. Jones et al. on Sep. 30, 2014 and U.S. Pat. No. 8,338,200 entitled "Frontside-Illuminated Inverted Quantum Well Infrared Photodetector Devices and Methods of Fabricating the Same" issued to David Forrai et al. on Dec. 25, 2012, each patent of which is incorporated by reference as if fully reproduced herein.

Further, as described above, the hyperspectral optical element 100 may comprise a standalone optical element that includes a notched layer 104 and a separate faceplate layer 102 coupled together, such as by one or more spacers, epoxies, frames or the like.

Because the depth of the gaps 110 determines the wavelength(s) of light signals that will resonate in the cavities 108, the notched layer 104 of the hyperspectral optical element can be tuned to target specific wavelengths of an infrared light signal. Thus, for a particular application, the depth(s) 110 of the notched surfaces 106 of the notched layer 104 may be tuned to target one or more particular wavelength of an infrared light signal for detection by an FPA detector. In one particular embodiment, for example, the varying depth gaps 110 defined by the height of the notched surfaces 106 of the notched layer 104 from the inner surface 103 of the faceplate layer 102 may comprise a plurality of sub-micron height change gaps 110 corresponding to sub-micron stepped notched surfaces 106 formed in the notched layer 104. Thus, in this particular embodiment, the plurality of varying depth gaps 110 provide a plurality of spatially distributed filters of the focal plane to provide spatial sampling of spectra along one dimension of the focal plane array and selectively receive the one or more wavelengths of the individual resonant structures defined by the varying depth gaps. Although FIG. 1 shows a linear pattern of height change gaps, any pattern of gaps defined by one or more notched surfaces 106 of the notched layer may be used, such as but not limited to stepped patterns, linear patterns, non-linear patterns, varying patterns, repeating patterns, non-repeating patterns and/or the like.

The offset distance of the notched surfaces 106 of the notched layer 104 from the inner surface 103 of the faceplate layer 102 may be controlled by one or more spacers 109 that are used to set the offset distances at desired cavity depths to resonate at one or more targeted wavelengths of an infrared light signal. In one embodiment, the spacers 109 may be disposed, for example, in one or more locations where they are unlikely to interfere with signal transmission through or within the hyperspectral optical element along edges, corners or other areas of the notched layer 104 and/or faceplate layer 102.

In one embodiment, for example, the offset distances for each of the notched surfaces 106 may be set by setting the offset distance of a single (e.g., lowest or highest notched surface 106) "reference" notched surface 106 via the spacers within a desired tolerance. If the remaining notched surfaces 106 are manufactured with an acceptable tolerance with reference to that reference notched surface 106, the remaining notched surfaces should define cavities having depths within similar acceptable tolerances to target one or more desired wavelengths of an infrared light signal.

The cavities 108 defined by the inner surface 103 of the faceplate layer 102 and the notched surfaces 106 of the notched layer 104 should be optically transmissive to optical radiation in the predetermined wavelength range (e.g., infrared and near infrared spectra). For example, air, gas, a vacuum, an optically transmissive liquid or optically transmissive solid medium may be disposed within the cavities 108 of the hyperspectral optical element.

The faceplate layer 102 and the notched layer 104 are coupled together. In one embodiment, for example, the faceplate layer 102 and the notched layer 104 are bonded, directly or indirectly, via an adhesive bonding layer, such as an epoxy adhesive. As discussed above, spacers 109 may be used to register one or more gap depths 108 of the cavities 108 to tune the hyperspectral optical element to one or more wavelengths of interest. If the adhesive bonding layer is present in a light transmission region of the hyperspectral optical element, the material used for the adhesive bonding layer should be optically transmissive to optical radiation in the predetermined wavelength range (e.g., infrared and near infrared spectra). If the adhesive bonding layer is only present outside the light transmission region of the hyperspectral optical element, however, any number of materials may be used for the adhesive bonding layer. The adhesive chosen may also be suitable for use from cryogenic temperatures to approximately 300° C., such that it does not outgas, deform, crack or otherwise degrade during fabrication and operation of the focal plane array.

A multiple-order resonance filter 120 may be provided for each cavity 108 of the hyperspectral optical element 100 in some embodiments. The filter 120 is adapted to remove multiple order resonance signals from the cavities 108 (or from a signal exiting the cavity) leaving only one or more targeted wavelengths to be delivered to the detector material 112. In one particular embodiment, for example, the multiple-order resonance filter 120 comprises a thin-film filter disposed on the inner surface 103 of the faceplate layer 102 and/or on the notched surfaces 106 of the notched layer 104. In this embodiment, the multiple-order filter 120 filters multiple-order resonant wavelengths within the cavities 108 of the hyperspectral optical element 100, leaving the targeted wavelength(s) resonating within the cavities 180. In various embodiments, the multiple-order resonance filter 120 may comprise a bandpass, high pass and/or low pass filter(s) adapted to remove one or more resonant wavelengths from a cavity 108. A thin-film filter 120 may be integrated into the hyperspectral optical element 100 to provide side band rejection as described in more detail with respect to FIG. 3.

Figure 2:
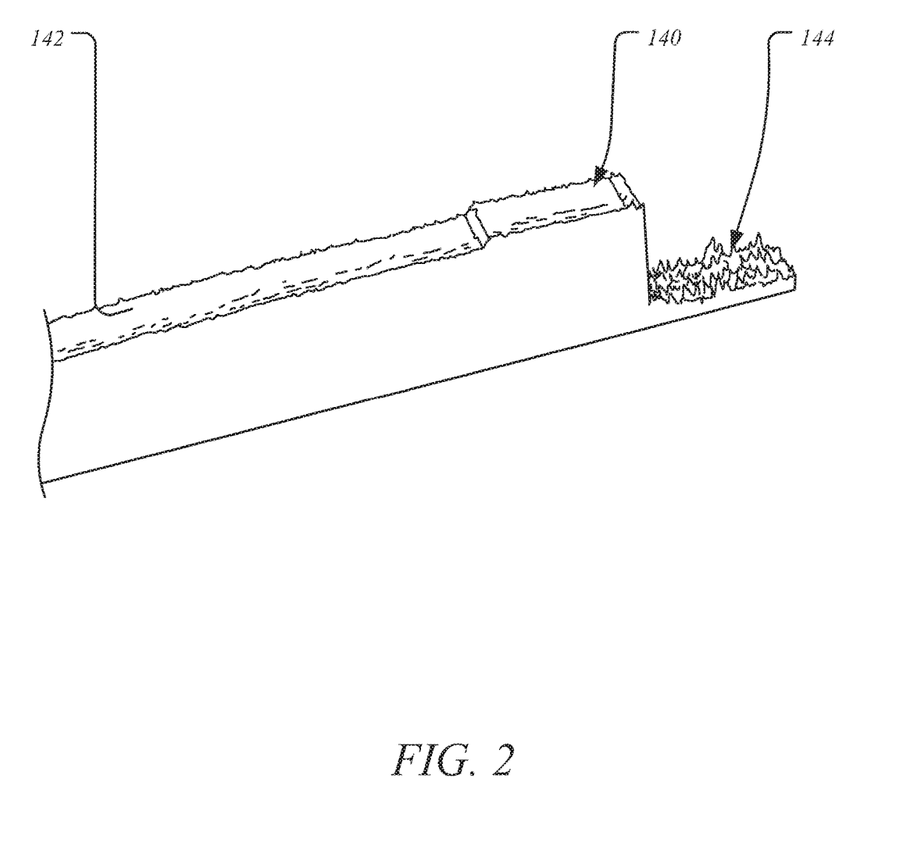
FIG. 2 depicts an image of an example step formed in a semiconductor layer via an ion beam etch process.

Referring now to FIG. 2, an image of a step structure 140 that was ion beam etched into silicon is shown. The step structure 140 shows feasibility of creating the step structure, such as the staircase structure shown in FIG. 1. In this particular example, the step structure 140 of a notched layer 142, such as the notched semiconductor layer 104 shown in FIG. 1, is shown. The step structure 140 in this particular embodiment was ion beam etched into a silicon notched layer 142. The image shows residual photoresist 144 remaining from the ion beam milling. The dimensions of the residual photoresist in 144 this particular example are much smaller than the wavelength of the infrared or near infrared light being collected by the cavity formed by the step structure 140 of a hyperspectral optical detector. In various embodiments, the residual photoresist may also be removed or reduced by various semiconductor processing operations, such as a strip process, a wash process, and/or a plasma ash process. Although a single step structure 140 is shown in FIG. 2, other steps and/or varying notches, such as shown in FIG. 1 may also be formed via a similar process.

Figure 3:
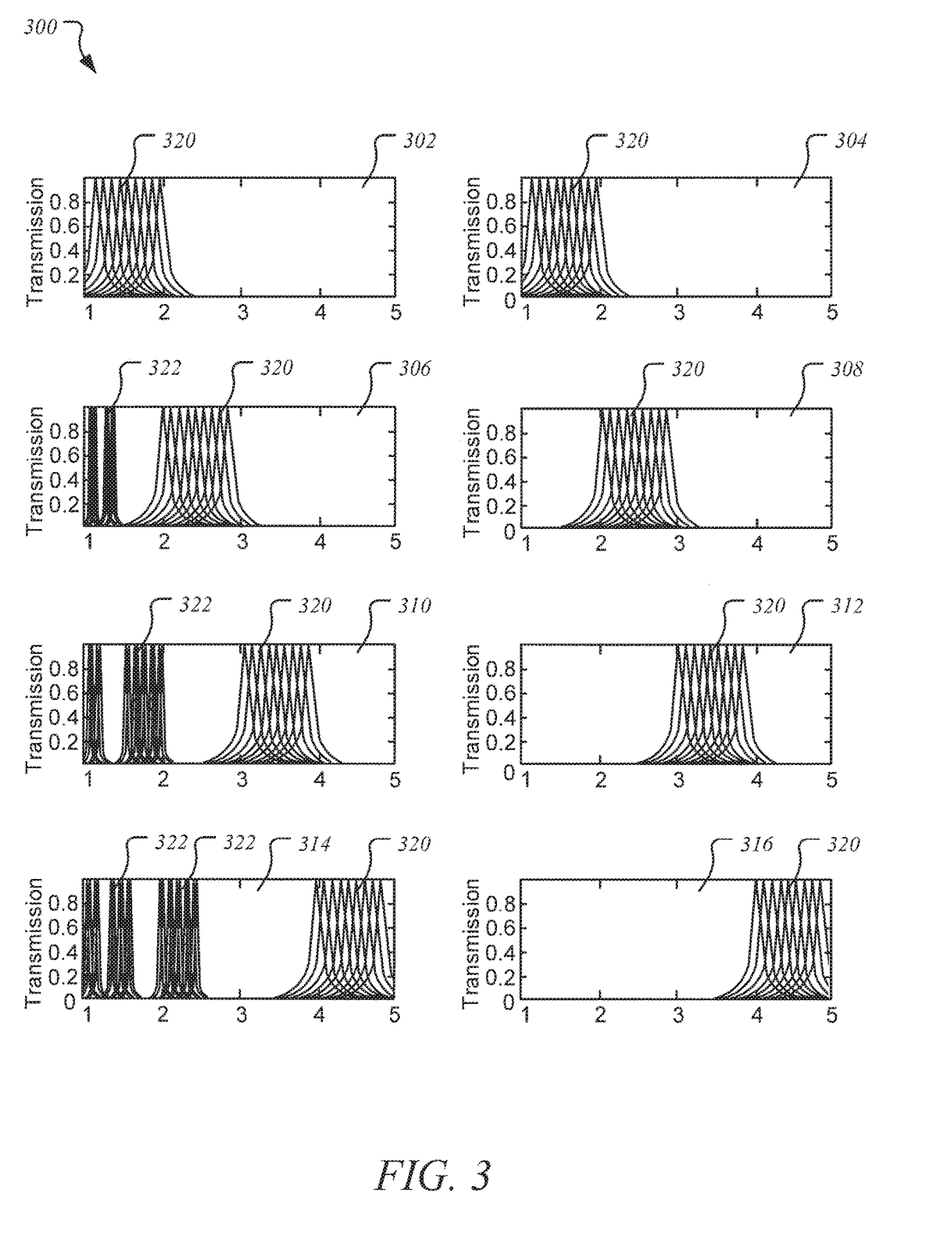
FIG. 3 depicts graphical representations of signal wavelengths ($\lambda$) resonant in four cavities of a hyperspectral optical element, according to one or more embodiments described and illustrated herein.

FIG. 3 depicts graphical representations 300 of signal wavelengths (k) resonant in four cavities of a hyperspectral optical element, such as described with reference to FIG. 1. The graphical representations on the left (302, 306, 310 and 314) show multiple-order resonances present in the signal resonating within the cavities before application of a filter, such as a multiple-order resonance filter 120 described with reference to FIG. 1. As can be seen in FIG. 3, the resonating signal comprises a plurality of peaks. In graphical representations 302, 306, 310, 314, for example, a band of target resonant wavelengths 320 include a plurality of relatively closely spaced peaks within a target wavelength band. A "side band" 322 includes a plurality of multiple-order, non-targeted wavelengths that also resonate within the cavities of the hyperspectral optical element (e.g., harmonics having a wavelength that is a fraction of the targeted wavelengths).

A multiple-order resonance filter (e.g., the multiple-order resonance filter 120 shown in FIG. 1) is applied to the signal wavelengths resonant in the four cavities of the hyperspectral optical element. The filter may comprise, for example, a bandpass filter, a low pass filter and/or a high pass filter. In this particular example, a high pass filter with a cutoff above the wavelengths of the side band multiple-order, non-targeted wavelengths but below the targeted wavelengths is applied to the signals resonant in the cavities of the hyperspectral optical element and the results are shown in the graphical representations on the right (304, 308, 312 and 316). As can be seen in the graphical representations 304, 308, 312, 316, the side band multiple-order, non-targeted wavelengths 322 have been removed, while the targeted resonant wavelengths 320 remain after application of the filter.

The targeted resonant wavelengths 320 in this example include a plurality of wavelength peaks disposed within the passband region. Where the resolution of individual pixels disposed on a notched surface of a cavity is sufficient, each peak may be separately sampled by different pixels of the hyperspectral optical element.

As described above, the graphical representation 302 depicts multiple-order resonances present in the signal resonating within a first cavity of a hyperspectral optical element corresponding to a first gap dimension defined by a first notched surface of the element before application of a multiple-order resonance filter, and graphical representation 304 depicts multiple-order resonances present in the signal resonating within the first cavity corresponding to the first gap dimension defined by the first notched surface after application of a multiple-order resonance filter. Similarly, the graphical representation 306 depicts multiple-order resonances present in the signal resonating within a second cavity of a hyperspectral optical element corresponding to a second gap dimension defined by a second notched surface of the element before application of a multiple-order resonance filter, and graphical representation 308 depicts multiple-order resonances present in the signal resonating within the second cavity corresponding to the second gap dimension defined by the second notched surface after application of a multiple-order resonance filter. The graphical representation 310 depicts multiple-order resonances present in the signal resonating within a third cavity of a hyperspectral optical element corresponding to a third gap dimension defined by a third notched surface of the element before application of a multiple-order resonance filter, and graphical representation 312 depicts multiple-order resonances present in the signal resonating within the third cavity corresponding to the third gap dimension defined by the third notched surface after application of a multiple-order resonance filter. Finally, the graphical representation 314 depicts multiple-order resonances present in the signal resonating within a fourth cavity of a hyperspectral optical element corresponding to a fourth gap dimension defined by a fourth notched surface of the element before application of a multiple-order resonance filter, and graphical representation 316 depicts multiple-order resonances present in the signal resonating within the fourth cavity corresponding to the fourth gap dimension defined by the first notched surface after application of a multiple-order resonance filter.

In the example shown in FIG. 3, for example, the targeted resonant wavelength of each cavity is progressively higher. For example, the targeted resonant wavelength of the first cavity is lower than the targeted resonant wavelength of the second cavity. The targeted resonant wavelength of the second cavity is lower than the targeted resonant wavelength of the third cavity, and the targeted resonant wavelength of the third cavity is lower than the targeted resonant wavelength of the fourth cavity.

As can be seen in FIG. 3, for example, the transmission signals resonating within the cavities include multiple order resonances. The application of a multiple-resonance filter, such as a high pass filter, to the signal, however, removes the lower wavelength resonances and the remaining resonant wavelength signal isolated by the individual spatial filters is shown in the graphs on the right.

Figure 4:
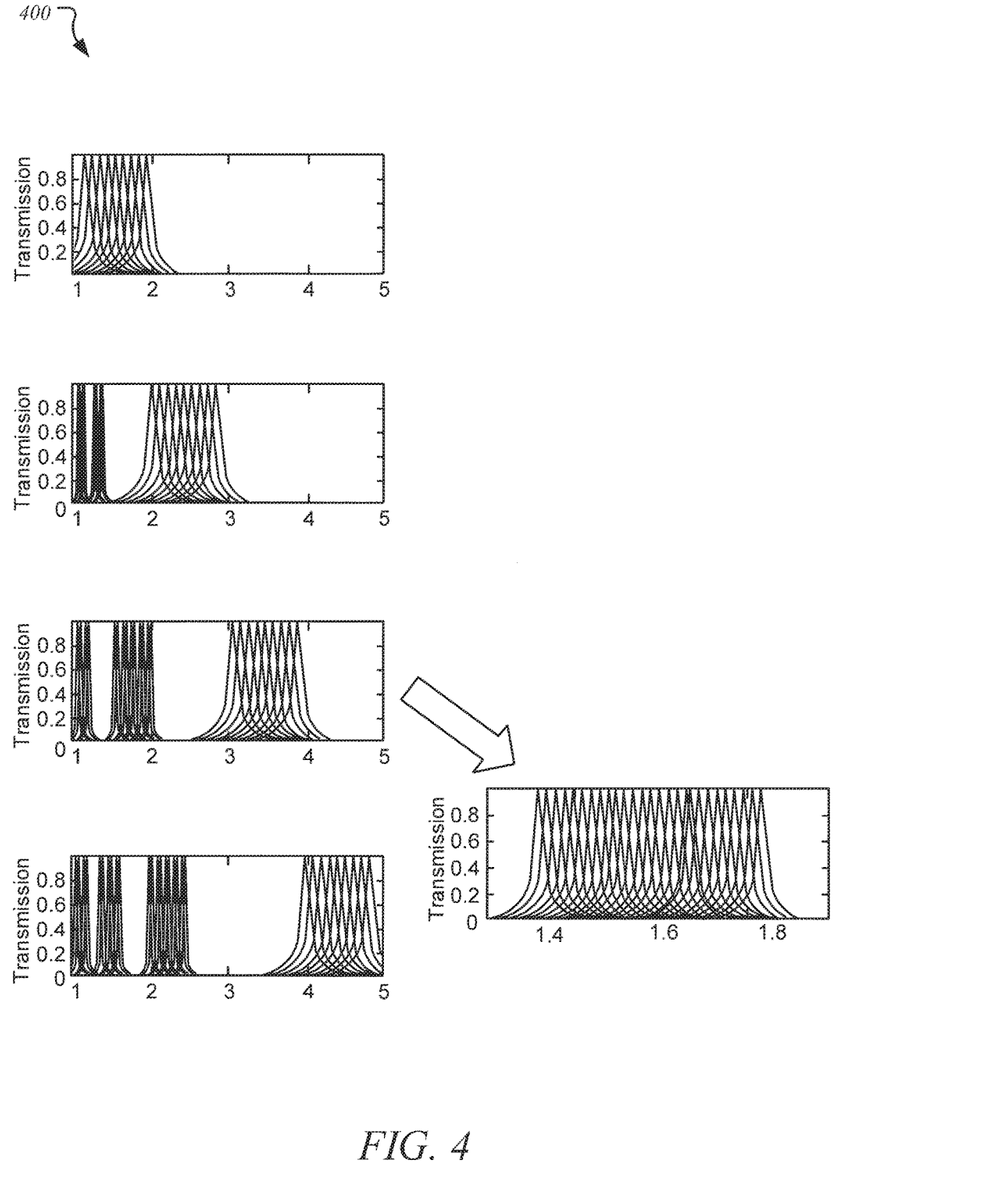
FIG. 4 depicts graphical representations of higher order optimization and sub-band selection for high resolution in specific bands, according to one or more embodiments described and illustrated herein.

FIG. 4 depicts graphical representations of higher order optimization and sub-band selection for high resolution in specific bands. The graphic representations illustrate that with larger gaps and a low pass or band pass filter, finer spectral resolution may be accomplished, as the peaks get narrower at the second order peaks.

As discussed above with respect to FIG. 3, a plurality of individual pixels disposed within the same cavity defined by a notched surface can provide a relatively high resolution in a specific band of targeted resonant wavelengths where the individual pixels are adapted to identify the individual peaks of the individual wavelengths resonant within the specific band targeted by the cavity.

In the specific example shown in FIG. 4, a band from 1.4 µm to 1.8 µm (H band) is graphically represented. The band may be isolated from a resonant signal including non-targeted resonant wavelengths by a passband multiple-order filter having a wavelength passband of 1.3 µm to 1.9 µm, for example. The resulting hyperspectral optical element may provide a 0.025 µm resolution where 16 individual pixels are arranged to separate peaks within the corresponding resolution of each of the pixels. As the number of pixels per band is increased, the resolution may similarly be increased.

Other example spectral regions of operation that may be separated from an infrared signal by the hyperspectral optical elements 100 described herein may include but are not limited to:

0.4 um. to 1 um. (40 bands) (glass on top of InSb)
    1 um. to 5.5 um. (40 bands) (silicon on top of InSb)
    8 um. to 14 um. (40 bands) (silicon on top of SLS/nBn)

In one implementation, for example, the spectral bandwidth is less than 250 nm FWHM and the spectral purity, band to band, is greater than 20 dB.

Figure 5:
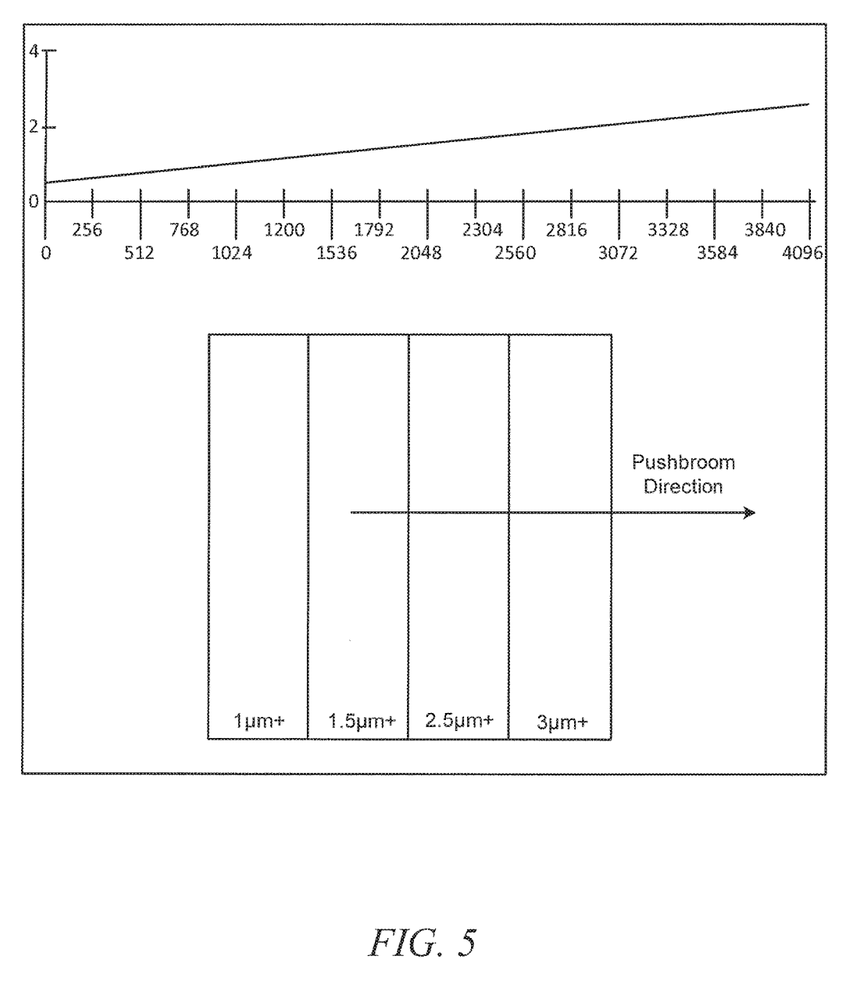
FIG. 5 depicts graphical representations of a push-broom acquisition mode of a ROIC of a hyperspectral FPA adapted to collect multiple spatial and spectral lines simultaneously, according to one or more embodiments described and illustrated herein.

FIG. 5 depicts graphical representations of a scanned acquisition mode for an FPA including a hyperspectral optical element and a read out integrated circuit (ROIC). The depiction illustrates a "push-broom" scan technique where vehicle motion moves a scene across each row of detectors. However, other scan techniques can be employed. As depicted, the rows of detectors are arranged perpendicular to a flight direction of an aircraft or spacecraft. The FPA spatially samples the scene orthogonal to the push-broom direction. The bands of the hyperspectral optical element measure the spectral contribution of each scene element (pixel). The overall image may be reconstructed. The scan speed, determined by the vehicle motion in the case of a push-broom approach, determines the spatial location of scene elements along the scan direction. Use of a push-broom scan approach is well known. The key is that each band of detector elements beneath each step of the hyperspectral optical element samples one waveband. Each signal has a known temporal component, its location along the scan timeline, and therefore its spatial location along the scan direction. Within the band, the detector elements measure the spectral signal. As the scan pushes the scene element to the next band, that same spatial location is now measured with a new waveband. In this way, the hyperspectral optical element may enable the sensor to build a hyperspectral data cube. The two-dimensional scene imaged by the sensor system may be reconstructed using the temporal characteristics of the known scan motion and each scene element's location within the integrated hyperspectral optical element FPA.

FIG. 5 shows the push-broom direction with an arrow extending across primary bands of the optical element corresponding to different notched surfaces of a notched layer. The hyperspectral optical element is adapted to collect multiple spatial and spectral lines simultaneously across the primary bands and pixels. Similar to a push-broom sensor the hyperspectral optical element provides a full two-dimensional (2-D) array. In some embodiments, for example, the array may provide high geometric and spectral registration fidelity (e.g., no split imaging and spectral smile).

For each frame imaged by the FPA from the multiple spatial and spectral lines isolated by the hyperspectral optical element, each FPA row contains different spatial data for each spectral bin. The data collected may be used to reconstruct a full data cube using data from each pixel detected over multiple frames.

In the graphical representation shown in FIG. 5, for example, four primary bands (1 µm, 1.5 µm, 2.5 µm and 3 µm) each include ten steps. In this particular example, the ten steps are 50 nm linearly spaced. Each step includes about 100 pixels across its width, for about 4096 pixels total with 40 total bands from 1 to 5 µm. The FPA is scanned in step direction to measure the full data cube, both spatially and spectrally.

In one embodiment, the push-broom read out ROIC is time delay integration (TDI) compatible. A plurality of readings of a single portion of a scene taken over time by the hyperspectral FPA may be spread across multiple pixels of the detector. The readings of the different pixels may be shifted with motion of an image across the pixels. This provides high sensitivity for moving images and can be used to reduce noise or other factors, such as uneven spacing or construction of individual pixels within the hyperspectral optical element and/or detector.

Figure 6:
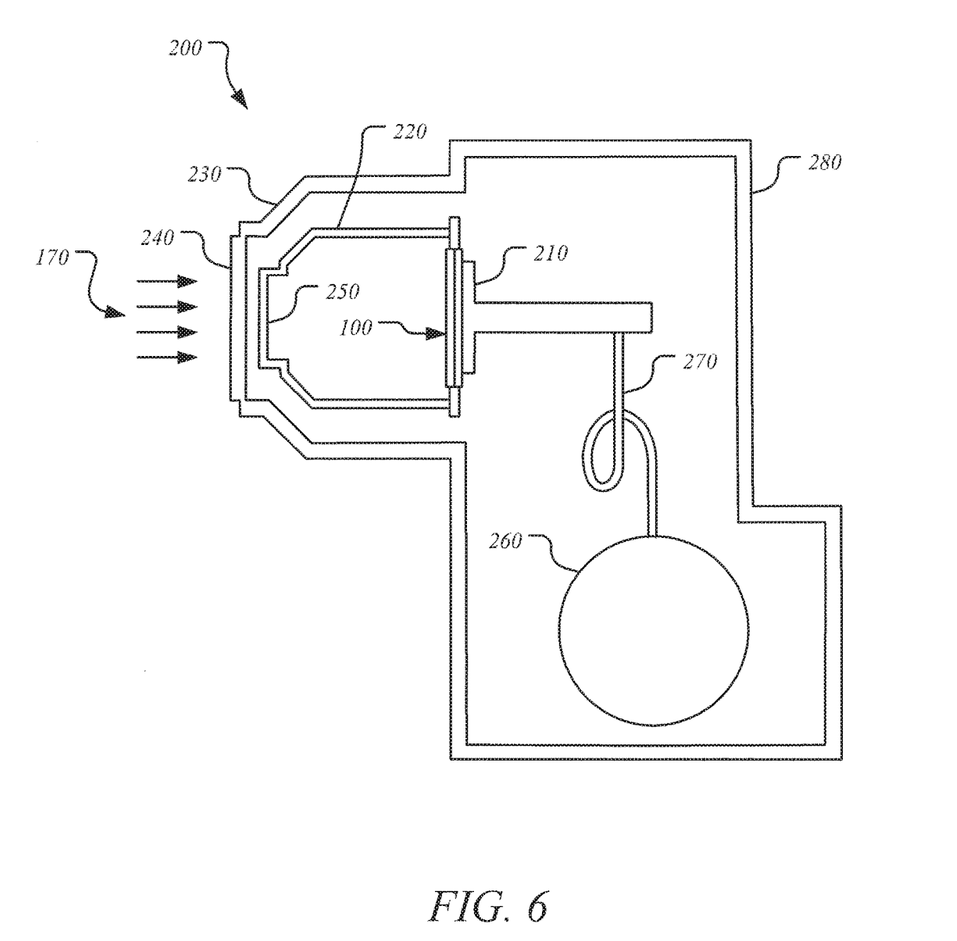
FIG. 6 depicts a schematic illustration of an infrared sensor device including a hyperspectral focal plane array, according to one or more embodiments described and illustrated herein.

Referring now to FIG. 6, the hyperspectral optical element 100 of a focal plane array may be provided as a component of an infrared sensor device 200 used in infrared sensing applications. FIG. 6 schematically depicts an infrared sensor device 200 according to some embodiments. The infrared sensor device 200 may generally comprise a hyperspectral optical element 100 of a focal plane array, a cooler device 260 disposed within a housing 280, a Dewar flask 230 and a cold shield 220. The hyperspectral optical element 100 of the focal plane array and the cold shield 220 are disposed in the Dewar flask 230, which provides a vacuum and may be coupled to one or more housing components (e.g., housing 280). An infrared transparent window 240 is provided in the Dewar flask 230 to allow radiation 170 to enter the infrared sensor device 200. The hyperspectral optical element 100 of the focal plane array is thermally coupled to a cold plate 210, which is in turn thermally coupled to a cold finger 270 of the cooler device 260. The cooler device 260 is configured to maintain the hyperspectral optical element 100 of the focal plane array within an operating temperature range (e.g., about 50K to about 200K). Nonlimiting examples of the cooler device 260 include a split sterling cycle linear cooler and a Rotary sterling cycle cooler. The cold plate 210 may be fabricated from a thermally conductive material, such as copper or aluminum, for example. It should be understood that other materials may be used.

The cold shield 220 is also thermally coupled to the cold finger 270 and the cooler device 260 (e.g., via thermal coupling to the cold plate 210). The cold shield 220 is configured to only let radiation 170 from the scene strike the photo sensitive area of the hyperspectral optical element 100 and focal plane array. The cold shield 220 may also include a cold filter 250 to control the spectral response of the infrared sensor device 200. The cold filter 250 may limit radiation from the scene that strikes the photosensitive area of the hyperspectral optical element 100 of the focal plane array to substantially transmissive portions of the atmosphere, (e.g. 2.0-2.5 µm, 3.0-5.0 µm, and 8.0-12.0 µm).

The infrared sensor device 200 may be implemented into an infrared camera system to detect infrared radiation within a predetermined wavelength range. For example, the infrared sensor device 200 may be communicably and electrically coupled to a display device (either locally or remotely) to display the scene as detected by the hyperspectral optical element 100 of the focal plane array. One or more controllers may also be communicably and electrically coupled to the infrared sensor device 200 to provide control signals to one or more components. For example, a control circuit may be provided to read the temperature of the hyperspectral optical element 100 of the focal plane array and provide the cooler device 260 with a proportional power drive to maintain the operating temperature of the hyperspectral optical element 100 of the focal plane array within a predetermined maximum temperature range. A controllable lens may also be provided and controlled to focus the infrared sensor device 200 accordingly.

For the purposes of describing and defining the embodiments of the present disclosure, it is noted that the terms "approximately" and "substantially" are utilized herein to represent the inherent degree of uncertainty that may be attributed to any quantitative comparison, value, measurement, or other representation. The terms "approximately" and "substantially" are also utilized herein to represent the degree by which a quantitative representation may vary from a stated reference without resulting in a change in the basic function of the subject matter at issue.

The foregoing description of the various embodiments of the present disclosure has been presented for the purposes of illustration and description. It is not intended to be exhaustive or to limit the subject matter of the disclosure to the precise steps and/or forms disclosed. Many alternatives, modifications and variations will be apparent to those skilled in the art of the above teaching. Moreover, although multiple inventive aspects have been presented, such aspects need not be utilized in combination, and various combinations of inventive aspects are possible in light of the various embodiments provided above. Accordingly, the above description is intended to embrace all possible alternatives, modifications, combinations, and variations that have been discussed or suggested herein, as well as all others that fall with the principles, spirit and broad scope of the inventions defined by the claims.

What is claimed is:

1. An hyperspectral optical element for monolithic detectors comprising:
 a faceplate layer adapted to be mounted on top of a monolithic detector, wherein the faceplate layer comprises a reflective inner surface; and
 a notched layer comprising a plurality of notched surfaces mounted to the faceplate layer, the notched surfaces opposing the reflective inner surface of the faceplate and defining a plurality of variable depth cavities between the reflective inner surface of the faceplate layer and the plurality of notched surfaces of the notched layer,
wherein the faceplate layer and the notched layer are substantially transparent to a received signal and the plurality of variable depth cavities provide resonant cavities for one or more wavelengths of the received signal.

2. The hyperspectral optical element of claim 1, further comprising a multiple-order resonance filter adapted to filter at least one resonant wavelength from a plurality of wavelengths resonating in at least one cavity.

3. The hyperspectral optical element of claim 2, wherein the multiple-order resonance filter comprises at least one of the group comprising: a bandpass filter, a high-pass filter and a low pass-filter.

4. The hyperspectral optical element of claim 2, wherein the multiple-order resonance filter comprises a thin-film filter disposed on at least one of the notched surfaces and the reflective inner surface of the faceplate layer.

5. The hyperspectral optical element of claim 4, wherein the thin film filter provides side band rejection.

6. The hyperspectral optical element of claim 1 wherein the received signal comprises at least one of an infrared and a near infrared signal.

7. The hyperspectral optical element of claim 1, wherein at least one of the variable depth cavities are registered via at least one spacer disposed between the faceplate layer and the notched layer.

8. The hyperspectral optical element of claim 1, wherein the top faceplate is mounted to a monolithic detector array.

9. The hyperspectral optical element of claim 1, wherein at least one notched surface of the notched layer comprises a plurality of pixels extending along the notched surface.

10. The hyperspectral optical element of claim 1, wherein an inside cavity created between the notched surfaces of the notched layer and the faceplate layer comprises at least two variable gap depths.

11. The hyperspectral optical element for monolithic detectors of claim 1, wherein notched surfaces of the notched layer are non-linear in notch depth and location on the notched material.

12. The hyperspectral optical element of claim 1, wherein notched surfaces on the notched layer have a stepped pattern in notch depth and location on the notched layer.

13. The hyperspectral optical element of claim 1, wherein the notched surfaces of the notched material comprise a Beyer-pattern in notch depth and location on the notched top material.

14. The hyperspectral optical element of claim 1, wherein the notched material is mounted to the faceplate via one or more spacers.

15. An hyperspectral detector comprising:
a monolithic detector comprising an at least substantially transparent faceplate layer adapted to receive a signal through the faceplate layer and a detector coupled to a first surface of the faceplate layer adapted to detect the signal, wherein the faceplate layer comprise an at least partially reflective surface opposite a detector facing surface of the faceplate layer; and
a substantially transparent notched layer comprising a plurality of notched surfaces mounted to the faceplate layer, the notched surfaces opposing the at least partially reflective surface of the faceplate and defining a plurality of variable depth cavities between the at least partially reflective surface of the faceplate layer and the plurality of notched surfaces of the notched layer,
wherein the plurality of variable depth cavities provide resonant cavities for one or more wavelengths of the received signal.

16. The hyperspectral detector of claim 15, further comprising a multiple-order resonance filter adapted to filter at least one resonant wavelength from a plurality of wavelengths resonating in at least one cavity.

17. The hyperspectral detector of claim 15, wherein at least one notched surface of the notched layer comprises a plurality of pixels extending along the notched surface.

18. The hyperspectral detector of claim 1, wherein the notched material is mounted to the faceplate via one or more spacers.

19. A method of separating at least one wavelength from a signal, the method comprising:
receiving the signal through a notched layer comprising a plurality of notched surfaces defining a plurality of variable depth cavities between the notched surfaces of the notched layer and a faceplate layer;
resonating at least one wavelength of the signal within at least one of the variable depth cavities, wherein the resonant wavelength corresponds to a depth of the at least one of the variable depth cavities; and
separating the at least one wavelength from the signal through the faceplate layer.

20. The method of claim 19 wherein the operation of separating the at least one wavelength comprises filtering a plurality of multiple-order resonant wavelengths.

* * * * *